(12) United States Patent
Rolfson

(10) Patent No.: US 7,494,750 B2
(45) Date of Patent: Feb. 24, 2009

(54) RETICLES

(75) Inventor: J. Brett Rolfson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 375 days.

(21) Appl. No.: 11/478,887

(22) Filed: Jun. 30, 2006

(65) Prior Publication Data

US 2006/0251974 A1 Nov. 9, 2006

Related U.S. Application Data

(63) Continuation of application No. 11/003,274, filed on Dec. 3, 2004.

(51) Int. Cl.
*G03F 1/00* (2006.01)
(52) U.S. Cl. .......................................................... 430/5
(58) Field of Classification Search ................... 430/5, 430/394; 378/35
See application file for complete search history.

(56) References Cited

U.S. PATENT DOCUMENTS

| 5,780,161 | A | 7/1998 | Hsu |
| 5,897,977 | A | 4/1999 | Carcia et al. |
| 6,194,103 | B1 | 2/2001 | Tzu et al. |
| 6,590,694 | B2 | 7/2003 | Matsushita et al. |
| 6,797,439 | B1 | 9/2004 | Alpay |
| 2001/0028983 | A1 | 10/2001 | Kawamura et al. |
| 2002/0132171 | A1 | 9/2002 | Levinson et al. |

FOREIGN PATENT DOCUMENTS

TW    475094 B    2/2002

OTHER PUBLICATIONS

US05/43549, Dec. 21, 2007, IPER.
US2005/043549, Jul. 10, 2006, PCT Written Opinion.
http://www.cerac.com/pubs/prodata/hfo2.htm CERAC, Inc.; Technical Publications; "Hafnium Oxide, HfO2 For Optical Coating".
Chen, H. et al., "Fabry-Perot-Type Antireflective Coating for Deep-Ultraviolet Binary Photomask Applications", Applied Optics, vol. 41, No. 19, Jul. 1, 2002, pp. 3961-3965.
US2005/043549, Dec. 2006, PCT Search Report.
The Electrochemical Society, Inc.; H.L. Chen et al. ; "Fabry-Perot Type Antireflective Coatings for Binary Mask Applications in ArF and F5 Excimer Laser Lithographies" (2003).
http://www.thinfilmproducts.umicore.com/evaportaion.asp "Evaporation Materials & Coating Materials for Vapor Deposition" (Mar. 3, 2006).

*Primary Examiner*—Stephen Rosasco
(74) *Attorney, Agent, or Firm*—Wells St. John P.S.

(57) ABSTRACT

The invention includes reticles and methods of forming reticles. In one aspect, a reticle can include a quartz-containing substrate, an attenuating layer, and an antireflective structure between the attenuating layer and the quartz-containing substrate. The invention can also include a reticle having a relatively transparent region between first and second surfaces, a relatively opaque region proximate the first surface, and a layer comprising one or both of metal fluoride and hafnium oxide proximate the first or second surface. The invention can also include methods of forming reticles in which an antireflective structure is formed over a surface of a quartz-containing substrate. The antireflective structure can comprise a Fabry-Perot pair, and in some aspects can comprise a layer containing one or both of metal fluoride and hafnium oxide.

14 Claims, 8 Drawing Sheets

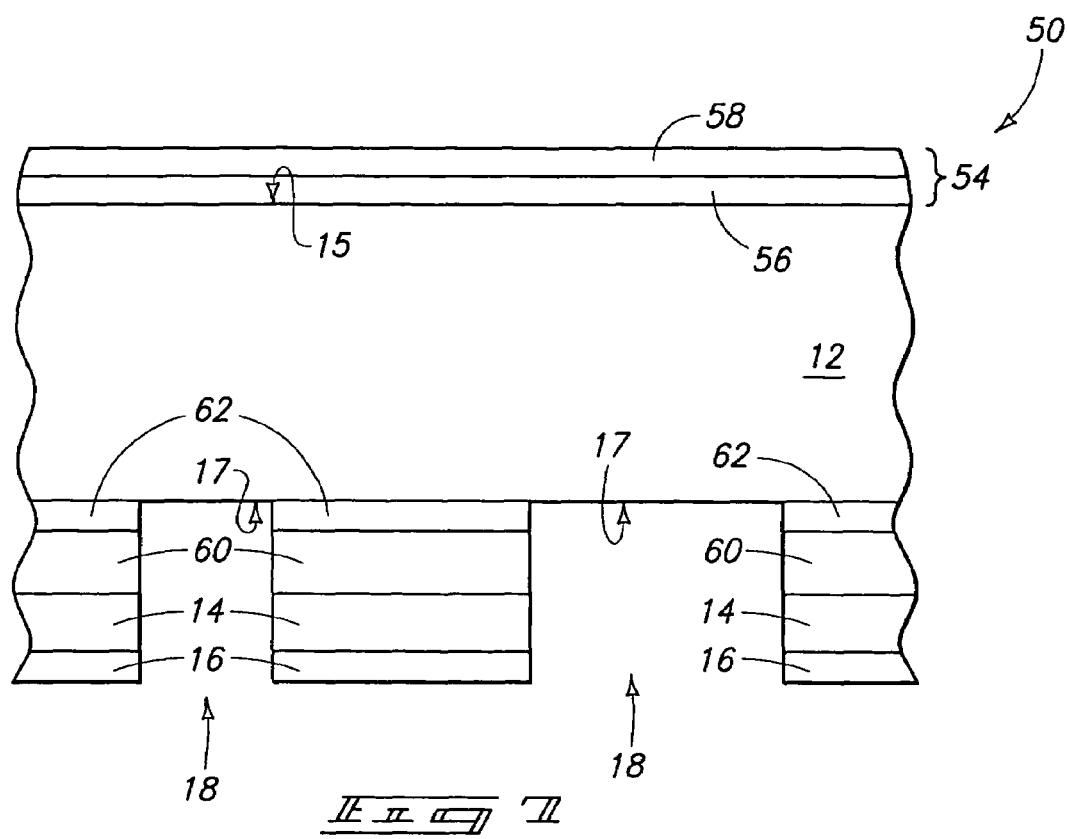
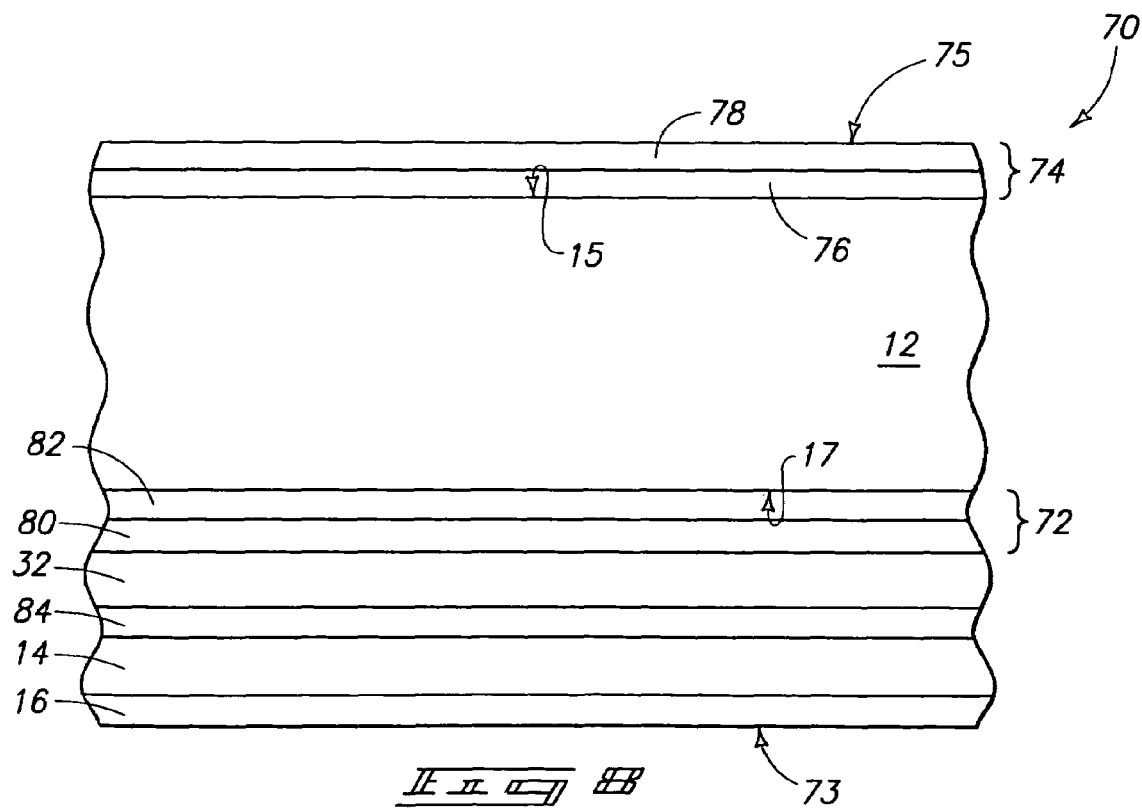

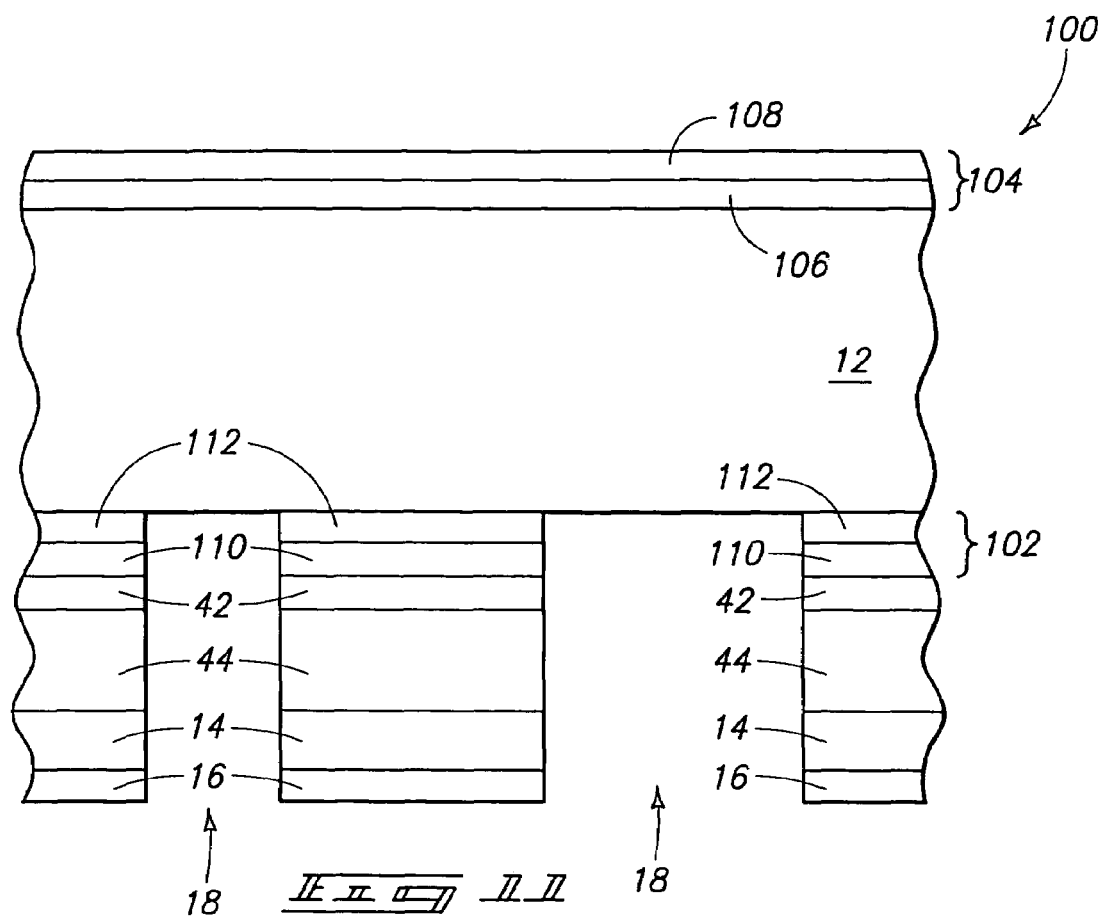
_Fig. 11_
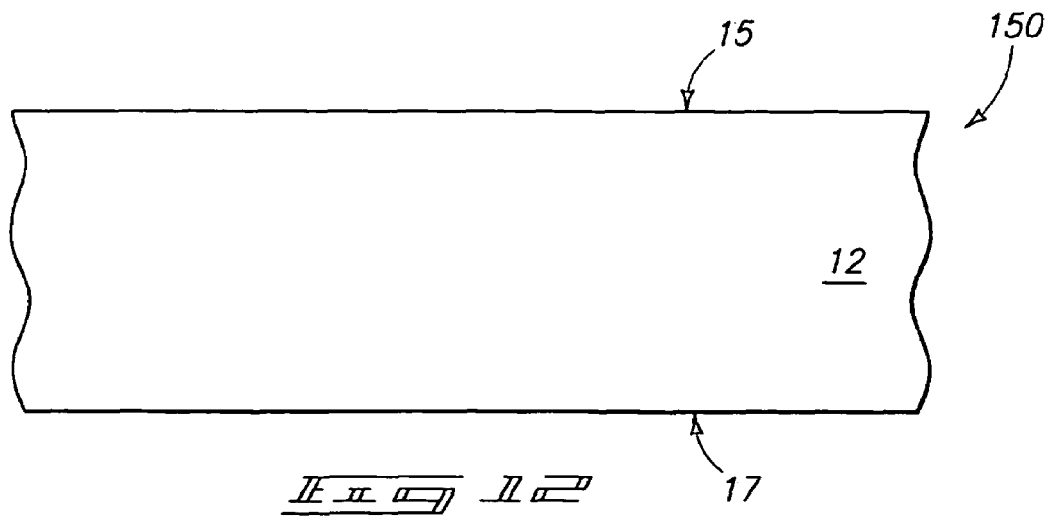
_Fig. 12_

RETICLES

RELATED PATENT DATA

This patent resulted from a continuation of U.S. patent application Ser. No. 11/003,274, which was filed Dec. 3, 2004, and which is hereby incorporated by reference.

TECHNICAL FIELD

The invention pertains to reticles and to methods of forming reticles.

BACKGROUND OF THE INVENTION

Radiation patterning tools are utilized during semiconductor processing to pattern radiation (such as, for example, ultraviolet light). The patterned radiation is projected against a radiation-imageable material (such as, for example, photoresist) and utilized to create a pattern in the radiation-imageable material. The utilization of patterned radiation for forming a desired pattern in a radiation-imageable material is typically referred to as photolithography. The radiation-patterning tools can be referred to as photomasks or reticles. The term "photomask" is traditionally understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the term "reticle" is utilized to generally refer to any radiation-patterning tool, regardless of whether the tool is utilized to pattern an entirety of a substrate or only a portion of the substrate.

An exemplary reticle 10 is illustrated in FIG. 1. The reticle comprises a substrate 12, and patterned layers 14 and 16 supported by the substrate. The substrate 12 is relatively transparent to radiation which is ultimately to be patterned by reticle 10, as compared to the material 14 which is relatively opaque to such radiation. The term "relatively" is utilized throughout this document to indicate that a material has a particular quantitative property relative to another. For instance, the term "relatively opaque" is utilized to indicate that a material is more opaque than another material, with such other material being referred to as being "relatively transparent". Also the term "relatively high refractive index" is utilized to indicate that a material has a higher refractive index than another material, with such other material being referred to as having a relatively low refractive index.

Typically, substrate 12 will comprise, consist essentially of, or consist of quartz; and material 14 will comprise, consist essentially of, or consist of chromium.

Openings 18 extend through the patterned layers 14 and 16. In operation, radiation is passed through substrate 12 and toward the layers 14 and 16. Such radiation is blocked by material 14, but passes through the windows 18. Accordingly, the radiation adopts a pattern upon passing through the reticle 10.

The radiation which is passed through reticle 10 can be back-reflected off of various surfaces beneath the reticle, and accordingly material 16 is provided in an attempt to preclude such back-reflected radiation from entering reticle 10. Material 16 will typically comprise, consist essentially of, or consist of chromium oxide or chromium oxynitride.

FIG. 2 shows the reticle 10 in operation. The reticle is shown above a lens 20, which in turn is above a semiconductor construction 22 comprising a radiation-imageable material 24.

Radiation (represented by arrows 26) passes downwardly through reticle 10 and is patterned by the combined opaque material 14 and windows 18 extending through the opaque material. The patterned radiation passes through focusing lens 20, and then to radiation-imageable material 24.

A problem that can occur during utilization of the reticle is that a fraction of the incident radiation can be reflected from interfaces of a quartz-containing substrate 12 and chrome-containing material 14 (so-called quartz/chrome interfaces), and travel within the substrate 12 to cause various problems, as discussed in more detail below with reference to FIG. 5. The reflected radiation is represented by arrows 28 in FIG. 2. Another problem that can occur is that some radiation can be reflected from a surface of the lens and back toward reticle 10 and not be blocked by material 16. The back-reflected radiation can then enter substrate 12 and cause various problems.

The reticle 10 of FIGS. 1 and 2 is commonly referred to as a binary mask structure. Other types of reticles are known in the art, and also commonly utilized. FIGS. 3 and 4 illustrate an embedded attenuated phase shifting mask reticle structure 30 and a bi-layer reticle structure 40, respectively. In referring to FIGS. 3 and 4, similar numbering will be utilized as was used above in describing FIG. 1, where appropriate. The reticle structure 30 of FIG. 3 comprises the substrate 12 described above with reference to FIG. 1. Construction 30 differs from the construction 10 of FIG. 1 in that the construction 30 comprises a radiation-phasing layer 32. The layers 14 and 16 (FIG. 1) may initially be present during patterning of layer 32, but will typically be removed from at least the primary patterned area of a reticle comprising the phasing material. The primary patterned area of a reticle is the portion of the reticle containing a pattern which is to be used in photolithographically patterning a photosensitive material. Other portions of the reticle can be referred to as boundary regions. Such other portions can be patterned with, for example, alignment markings, but are not generally used to pattern light during photolithography. It is common for the layers 14 and 16 to remain over the boundary region.

Phasing material 32 can comprise numerous compositions known in the art, and in typical aspects will comprise $Mo_wSi_xO_yN_z$, where w, x, y and z are numbers greater than zero. The openings 18 typically extend through phasing material 32, as shown.

The reticle structure 40 of FIG. 4 also comprises the substrate 12 discussed previously with reference to FIG. 1. Additionally, the structure 40 comprises a radiation-attenuating layer 42 and a final shifting layer 44. The radiation-attenuating layer 42 will typically comprise, consist essentially of, or consist of tantalum, and the shifting layer 44 will typically comprise, consist essentially of, or consist of silicon dioxide. In some aspects, the radiation-attenuating layer can comprise, consist essentially of, or consist of hafnium-doped tantalum; and in some aspects the shifting layer can comprise, consist essentially of, or consist of nitrogen-doped silicon dioxide. The openings 18 will typically extend through radiation-attenuating layer 42 and shifting layer 44, as shown. The layers 14 and 16 (FIG. 1) may initially be present during patterning of one or both of layers 42 and 44, but will typically be removed from at least the primary patterned area of a reticle comprising the layers 42 and 44.

Various problems can exist with all of the prior art reticles described with reference to FIGS. 1, 3 and 4, and with other types of reticles, due to light reflected from quartz/chrome interfaces or other interfaces, and/or due to back-reflected light entering the reticles. It would be desirable to alleviate such problems.

SUMMARY OF THE INVENTION

In one aspect, the invention includes a reticle which comprises a quartz-containing substrate, an attenuating layer supported by the quartz-containing substrate, and an antireflective structure between the attenuating layer and the quartz-containing substrate.

In another aspect, the invention encompasses a reticle which comprises a pair of opposing surfaces. One of the surfaces is a first surface and the other is a second surface. A relatively transparent region (such as a quartz-containing substrate) is between the first and second surfaces. A layer comprising one or more of metal fluoride, niobium oxide (such as niobium pentoxide) and hafnium oxide is proximate the first or second surface.

In one aspect, the invention includes a reticle having a pair of opposing surfaces, with one of the surfaces being referred to as a first surface and the other being referred to as a second surface. A relatively opaque material is proximate the first surface, and a relatively transparent material is over the relatively opaque material. A pattern of openings extend into the reticle in a primary patterned region, and the relatively opaque material is not within the primary patterned region. A Fabry-Perot pair is over the relatively transparent material and proximate the second surface. The Fabry-Perot pair comprises a relatively low refractive index material which itself comprises the second surface, and the Fabry-Perot pair comprises a relatively high refractive index material adjacent the relatively low refractive index material.

In one aspect, the invention includes a method of forming a reticle. A quartz-containing substrate is provided. The substrate has a pair of opposing surfaces, with one of the surfaces being a first surface and the other being a second surface. An antireflective structure is formed over one of the first and second surfaces, and a substantially opaque material is formed over the first surface. A pattern of openings is formed to extend through the substantially opaque material.

BRIEF DESCRIPTION OF THE DRAWINGS

Preferred embodiments of the invention are described below with reference to the following accompanying drawings.

FIG. 7 is a view of the FIG. 6 fragment shown a processing stage subsequent to that of FIG. 6.

FIG. 8 is a diagrammatic, cross-sectional, fragmentary view of a reticle structure illustrating another aspect of the present invention.

FIG. 11 is a view of the FIG. 10 fragment shown at a processing stage subsequent to that of FIG. 10.

FIG. 12 is a diagrammatic, cross-sectional, fragmentary view of a reticle structure substrate shown at a preliminary processing stage of an exemplary aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
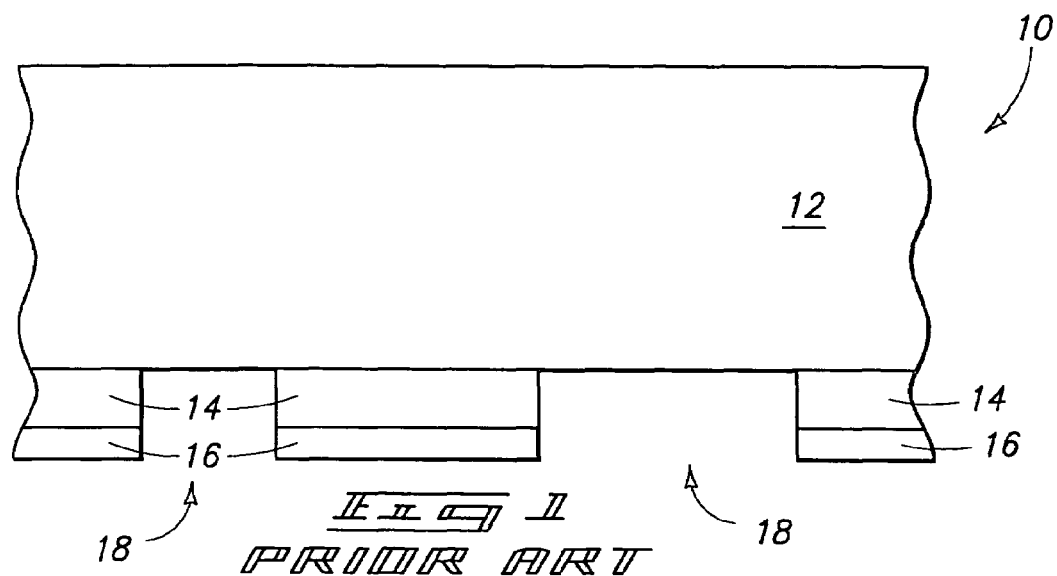
FIG. 1 is a diagrammatic, cross-sectional view of a fragment of a prior art reticle structure.
Figure 5:
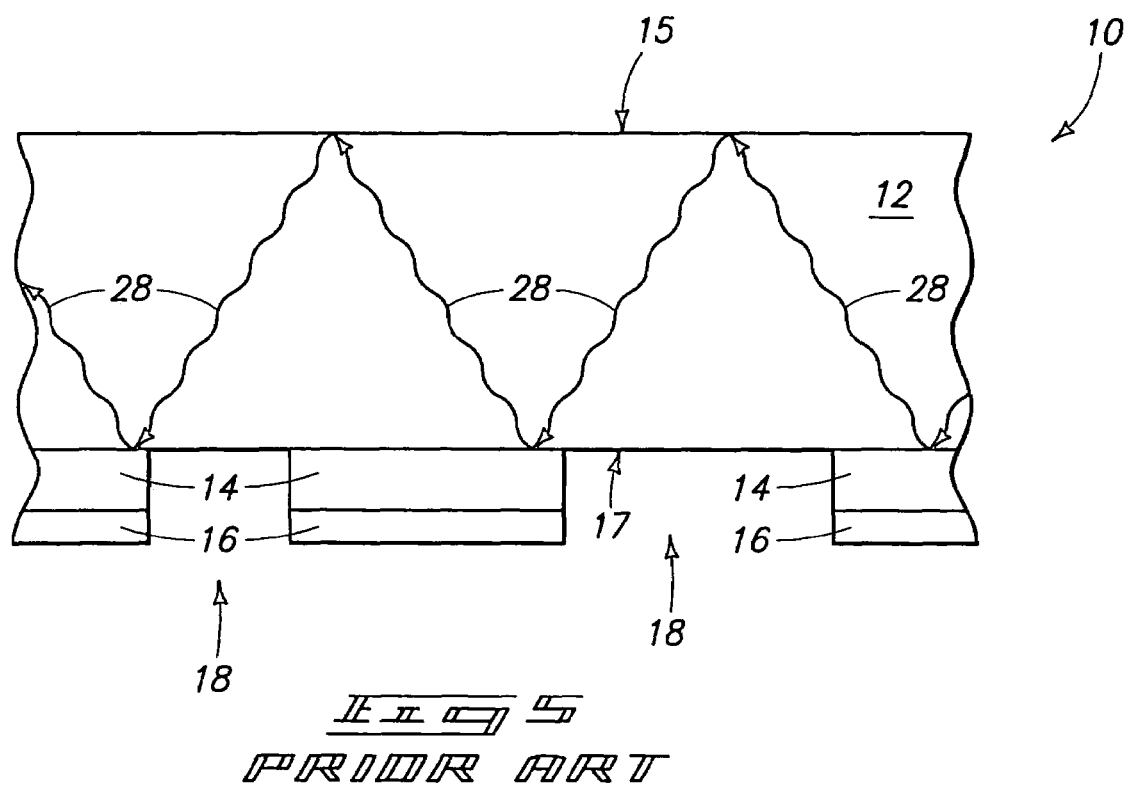
FIG. 5 is a diagrammatic, cross-sectional, fragmentary view of a prior art reticle illustrating a problem which can occur with such reticle.

One aspect of the invention is a recognition that various prior art problems can result from stray radiation within prior art reticles. FIG. 5 illustrates the prior art reticle 10 described previously with reference to FIG. 1, and shows stray radiation 28 light-piping within the reticle. The stray radiation can result from back-reflection off of a quartz/chrome or other interface within the reticle, and/or can result from scattered light reflecting into the reticle at an angle which allows the scattered radiation to pass around the patterned antireflective material 16.

The radiation 28 within reticle construction 10 light-pipes off from interfaces at opposing surfaces of substrate 12. Specifically, there is an air/substrate interface at surface 15, and a substrate/opaque material at opposing surface 17 of substrate 12. There are also some air/substrate interfaces along surface 17 within the openings 18. As discussed above, substrate 12 will typically comprise quartz and opaque material 14 will typically comprise chromium. Accordingly, there is a air/quartz interface along surface 15, and both quartz/chromium and air/quartz interfaces along surface 17. Typical patterning radiation utilized with the reticle can have a wavelength of about 248 nanometers, a wavelength of 193 nanometers, or any other suitable wavelength. The air/quartz interface will have a reflectivity for such wavelength of light of about 4%, and the quartz/chrome interface will have reflectivity for such radiation of about 35%. Accordingly, if stray radiation 28 migrates within reticle 12 at the appropriate angle, such radiation can effectively bounce back and forth within the reticle between reflective interfaces associated with surfaces 15 and 17. Eventually the internally-reflected radiation can hit one of the surfaces at an appropriate angle such that the radiation can exit the reticle. If the radiation exits downwardly from the reticle, it can interact with a radiation-imageable material beneath the reticle to cause an undesired pattern within the radiation-imageable material.

Figure 2:
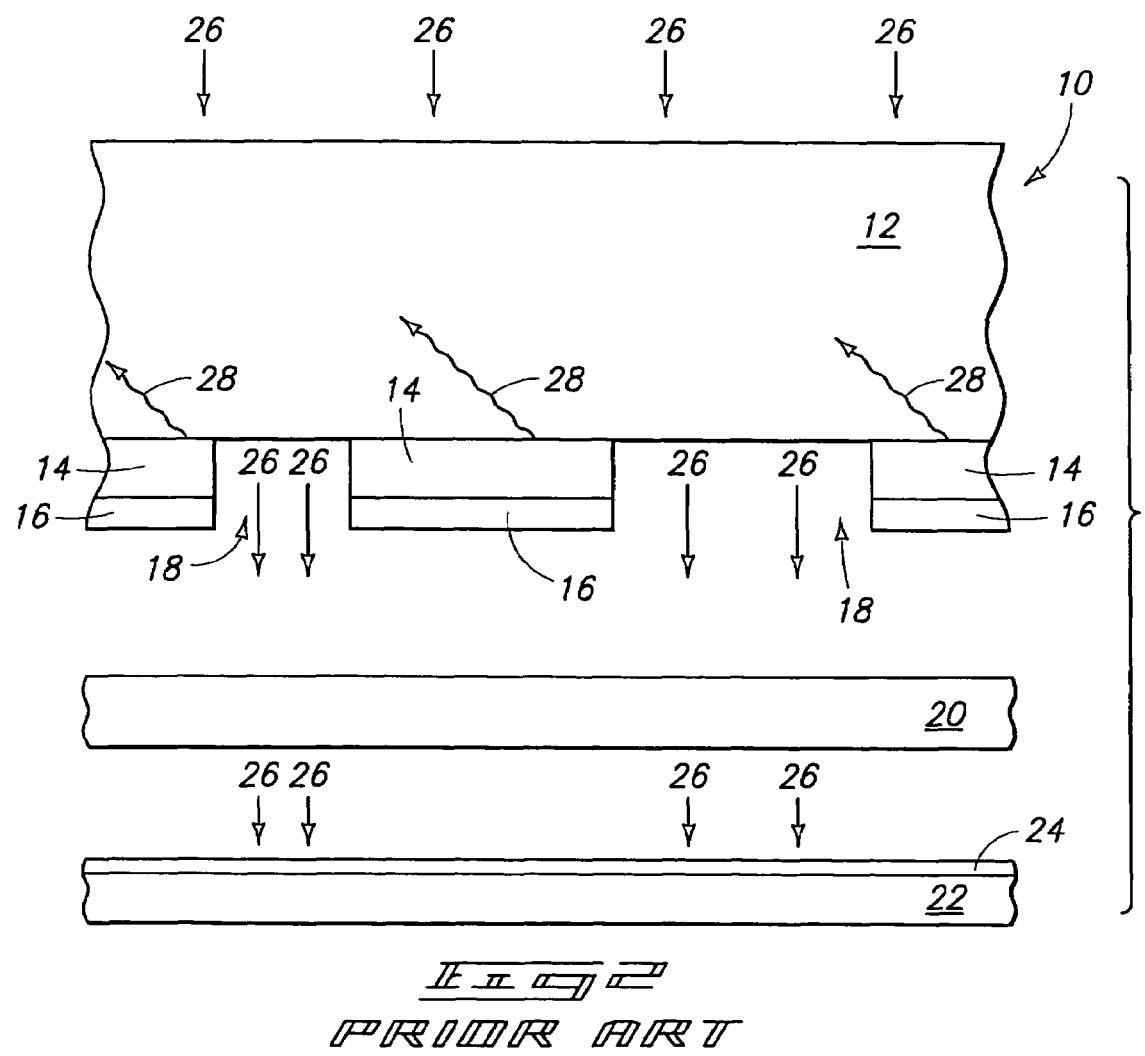
FIG. 2 is a diagrammatic, cross-sectional, fragmentary view of the reticle structure of FIG. 1 being utilized in combination with a focusing lens to pattern radiation directed toward a radiation-imageable material

A problem frequently encountered in the prior art is so-called ghosting of radiation patterns in regions of radiation-imageable material where the patterns are not desired. FIG. 2 shows a process in which the patterned radiation is directed onto a specific region of a radiation-imageable material. The ghosting problem encountered in the prior art is that there will sometimes be a ghost of such pattern on an adjacent region of the radiation-imageable material. The prior art has addressed the problem of ghosting by recognizing that ghosting typically occurs within a particular distance of a desired image, and thus has spaced patterned images far enough from one another so that any ghosting which occurs will occur between the patterned images rather than overlapping one of the patterned images. Accordingly, when dies are patterned across a semiconductor wafer substrate, some of the substrate real estate is wasted to provide buffer regions where ghosting may occur.

The mechanism presented with respect to FIG. 5 can explain how the ghosting is occurring. Specifically, such mechanism explains that internally-reflected radiation migrates through the reticle and then exits the reticle in a manner which can occasionally produce a patterned image in a location offset from where a desired patterned image is intended to be formed with the reticle.

One aspect of the present invention is to form reticle structures which alleviate, and preferably overcome, the problem of radiation light-piping through a reticle. Such aspect can comprise provision of antireflective structures along various surfaces of the reticle, and/or within the reticle. In particular aspects, the antireflective structures can be formed over one or both of the surfaces 15 and 17 described with reference to FIG. 5.

Although the invention is described with reference to a mechanism for preventing light-piping through a reticle, it is to be understood that the invention is not limited to such mechanism. For instance, as discussed below, the invention includes various reticle constructions having components associated therewith which can alleviate and/or prevent the light-piping discussed above with reference to FIG. 5. The claims which follow recite the structures themselves, without reference to the alleviation of light-piping. The invention is to be understood as being limited by the claims as literally worded, and in accordance with the doctrine of equivalents. Thus, in some aspects the invention pertains to particular structures which may or may not be utilized to prevent light-piping.

A first exemplary reticle which can be formed in accordance with an aspect of the present invention is described with reference to FIGS. 6 and 7. In referring to FIGS. 6 and 7, similar numbering will be used as was utilized above in describing FIG. 1, where appropriate.

Figure 6:
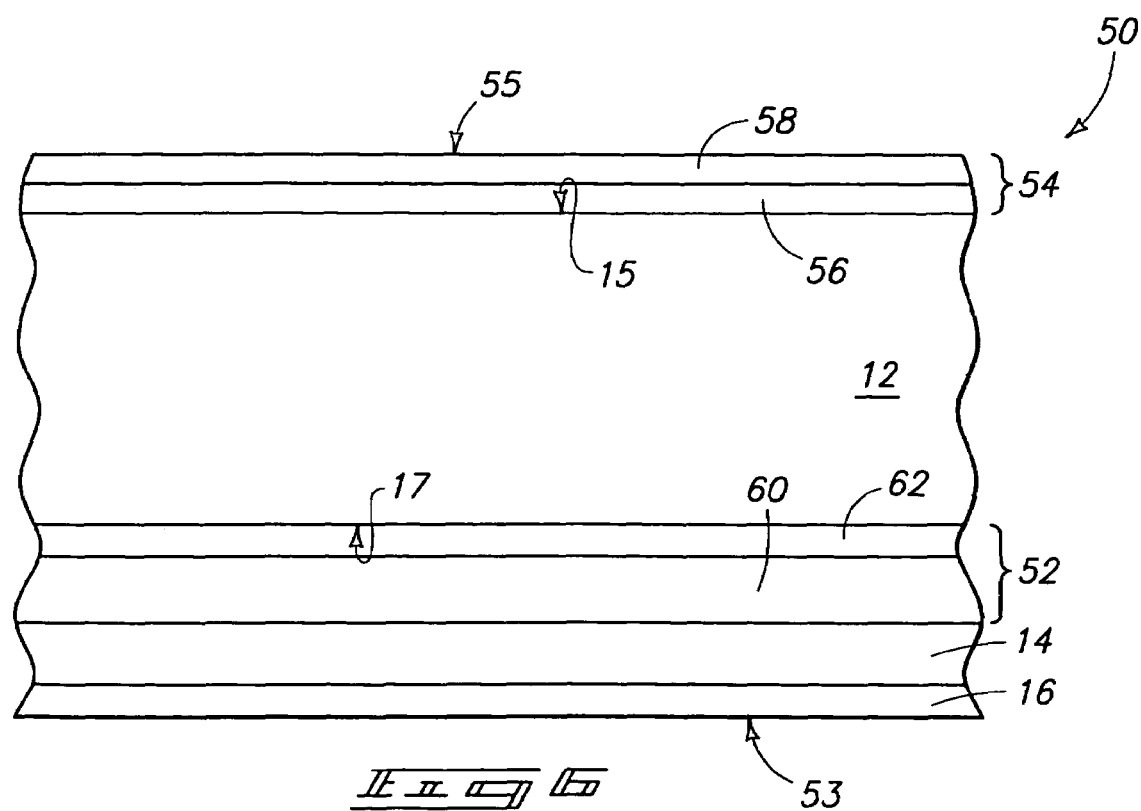
FIG. 6 is a diagrammatic, cross-sectional, fragmentary view of a reticle structure at a preliminary processing stage of an exemplary aspect of the present invention.

FIG. 6 shows a construction 50 comprising the relatively transparent substrate 12, relatively opaque material 14, and antireflective material 16 described previously with reference to FIG. 1. Structure 50 further comprises a first antireflective structure 52 over surface 17 of substrate 12, and a second antireflective structure 54 along the surface 15 of substrate 12. Antireflective structure 52 comprises a pair of layers 60 and 62, while antireflective structure 54 comprises a pair of layers 56 and 58. The layers 56 and 58 can correspond to a relatively high refractive index material and relatively low refractive index material, respectively; and similarly the layers 60 and 62 can correspond to a relatively low refractive index material and relatively high refractive index material, respectively.

Layers 56 and 58 can thus correspond to a first Fabry-Perot pair, and layers 60 and 62 can correspond to a second Fabry-Perot pair, with Fabry-Perot pairs being known in the art to have antireflective properties.

In particular aspects, the material 56 having a high refractive index relative to material 58 can comprise, consist essentially of, or consist of one or more of chromium, metal fluoride, niobium oxide and hafnium oxide. The metal fluoride can, for example, be selected from the group consisting of calcium fluoride and magnesium fluoride, and accordingly layer 56 can, in some aspects, comprise, consist essentially of, or consist of one or both of calcium fluoride and magnesium fluoride. The layer 58 having the low refractive index relative to material 56 can, in some aspects, comprise, consist essentially of, or consist of one or both of silicon dioxide and fused silica.

The layers 60 and 62 can be identical in composition to the above-described layers 58 and 60, respectively, or can be different in composition. In particular aspects, the layer 62 having the high refractive index relative to layer 60 can comprise, consist essentially of, or consist of chromium; and the layer 60 can comprise, consist essentially of, or consist of silicon dioxide or fused silica.

In the shown aspect of the invention, the first antireflective structure 52 is over the relatively-opaque region 14. The antireflective structure 52 comprises a relatively low refractive index layer 60 which is directly against (i.e. touching) relatively opaque region 14, and comprises a relatively high refractive index layer 62 which is directly against surface 17 of relatively transparent region 12. The second antireflective structure 54 is over relatively transparent region 12, and comprises a relatively high refractive index layer 56 which is directly against the uppermost surface 15 of relatively transparent region 12.

Although the antireflective structures 52 and 54 are shown comprising Fabry-Perot pairs, it is to be understood that the structures can, in other aspects of the invention (not shown) have other constructions. For instance, the relatively high refractive index materials (56 and 62) can be utilized alone, rather than paired with the low-refractive index materials (58 and 60). Also, although the structures 52 and 54 are shown to each comprise paired materials (56/58 and 60/62, respectively), it is to be understood that the antireflective structures can comprise less than two layers or more than two layers in some aspects of the invention, but will typically comprise at least one layer having a higher refractive index than the relatively transparent material 12.

Construction 50 can be considered to comprise a pair of opposing surfaces 53 and 55, which can be referred to as a first surface and a second surface, respectively. The relatively opaque region 14 is proximate the first surface, and the first antireflective structure 52 can also be considered to be proximate the first surface. In contrast, the second antireflective structure 54 can be considered to be proximate the second surface. In the shown aspect, the second antireflective structure 54 comprises a Fabry-Perot pair, with the low refractive index material of such pair comprising the second surface 55.

Although surfaces 53 and 55 are referred to as first and second surfaces, respectively, in the discussion that follows, it is to be understood that the terms "first" and "second" are merely labels to distinguish the surfaces from one another, and accordingly surfaces 53 and 55 can also be referred to as a second surface and a first surface, respectively, in the claims that follow. Similarly, although antireflective structures 52 and 54 are referred to as a first structure and a second structure, respectively, it is to be understood that the labels can be reversed so that structures similar to the structures 52 and 54 can be described in the claims that follow as second structures and first structures, respectively.

Referring next to FIG. 7, openings 18 are formed through layers 14, 16, 60 and 62, with such openings corresponding to a pattern of openings. The structure 50 having the openings 18 therein is a reticle which can ultimately be utilized for patterning radiation. The structure 50 can be considered to correspond to a binary mask reticle structure analogous to the structure of FIG. 1, but modified in accordance with the present invention to have additional antireflective structures associated therewith which were not associated with prior art binary mask reticle structures.

Although the openings 18 are shown extending through layers 60 and 62, it is to be understood that the invention encompasses other aspects (not shown) in which the openings extend only through relatively opaque material 14, and do not extend through layers 60 and 62. If layer 62 comprises a relatively opaque material (such as chromium) it can be advantageous to extend the openings 18 through layer 62. In contrast, if layer 62 comprises a relatively transparent material, it can be advantageous that the openings not extend through layer 62.

The thicknesses of layers 56, 58, 60 and 62 can be any suitable thicknesses. In particular aspects, the thickness of a high-refractive index component of a Fabry-Perot pair will be approximately the wavelength of light intended to be utilized with the reticle divided by four. More specifically, the thickness can be determined as the wavelength of light intended to be utilized by the reticle divided by four times the refractive index of the high refractive index component of the Fabry-Perot pair. In other words, the thickness of the high refractive components of the Fabry-Perot pair can be calculated utilizing the formula $T = \text{lambda}/(4n)$, where T equals thickness, and n equals the refractive index of the high refractive index material. In an exemplary aspect in which the high refractive index material comprises hafnium oxide (which has a refractive index of 2.37), and such is utilized with light having a wavelength of 248 nanometers (which corresponds to 2480 Å), the thickness can be determined as 2480 Å/(4*2.37) which equals about 262 Å. Accordingly, the hafnium oxide will be formed to a thickness of about 262 Å, and typically will be formed to a thickness within a range of from about 65 Å to about 1000 Å. If the materials 60 and 62 correspond to silicon dioxide and chromium, respectively, such materials can be formed to thicknesses of about 310 Å and about 240 Å, respectively; with the silicon dioxide typically being formed to a thickness within a range of from about 75 Å to about 1200 Å, and the chromium typically being formed to a thickness within a range of from about 60 Å to about 1000 Å.

If antireflective structure 54 comprises hafnium oxide as layer 56 and silicon dioxide as layer 58, such can reduce reflectivity from surface 15 of substrate 12 to about 0.5% or less; and if materials 60 and 62 correspond to silicon dioxide, and chromium, respectively, such can reduce reflectance from surface 17 of material 12 to less than or equal to about 0.5%. Accordingly, utilization of antireflective structures 52 and 54 can significantly reduce reflectance from surfaces 15 and 17 of relatively transparent material 12 relative to the reflectance which would occur with prior art reticle structures. This can alleviate, and in some cases even prevent, the light-piping problem encountered with prior art reticle structures.

Figure 3:
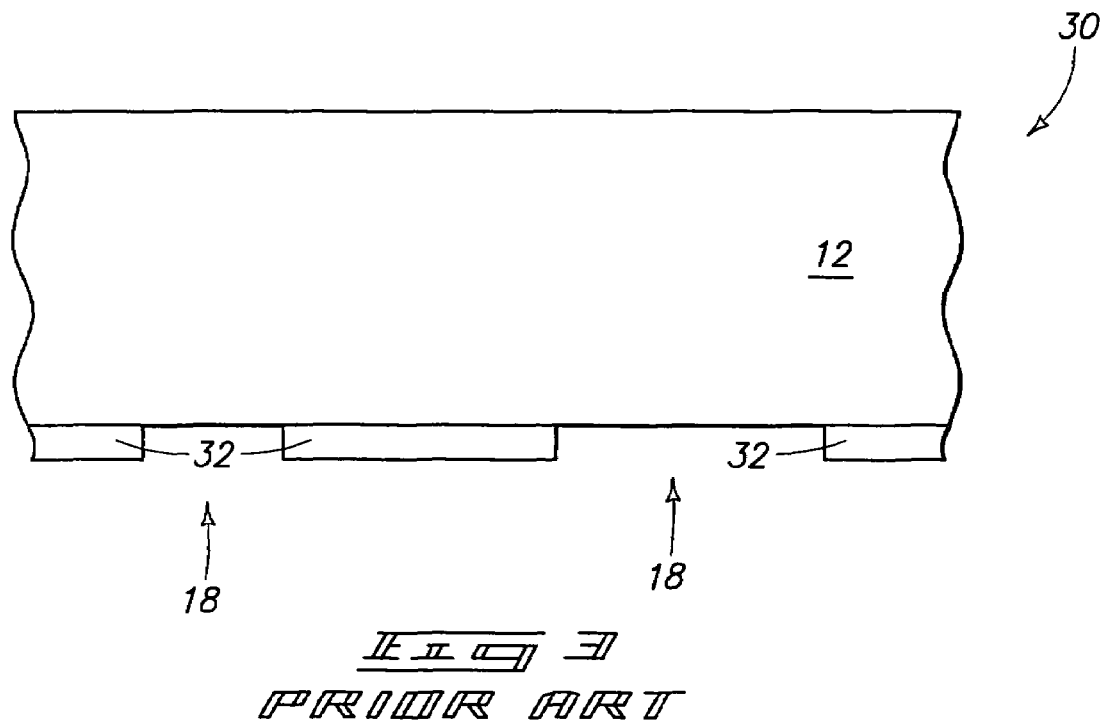
FIG. 3 is a diagrammatic, cross-sectional view of a reticle structure fragment in accordance with another aspect of the prior art.
Figure 4:
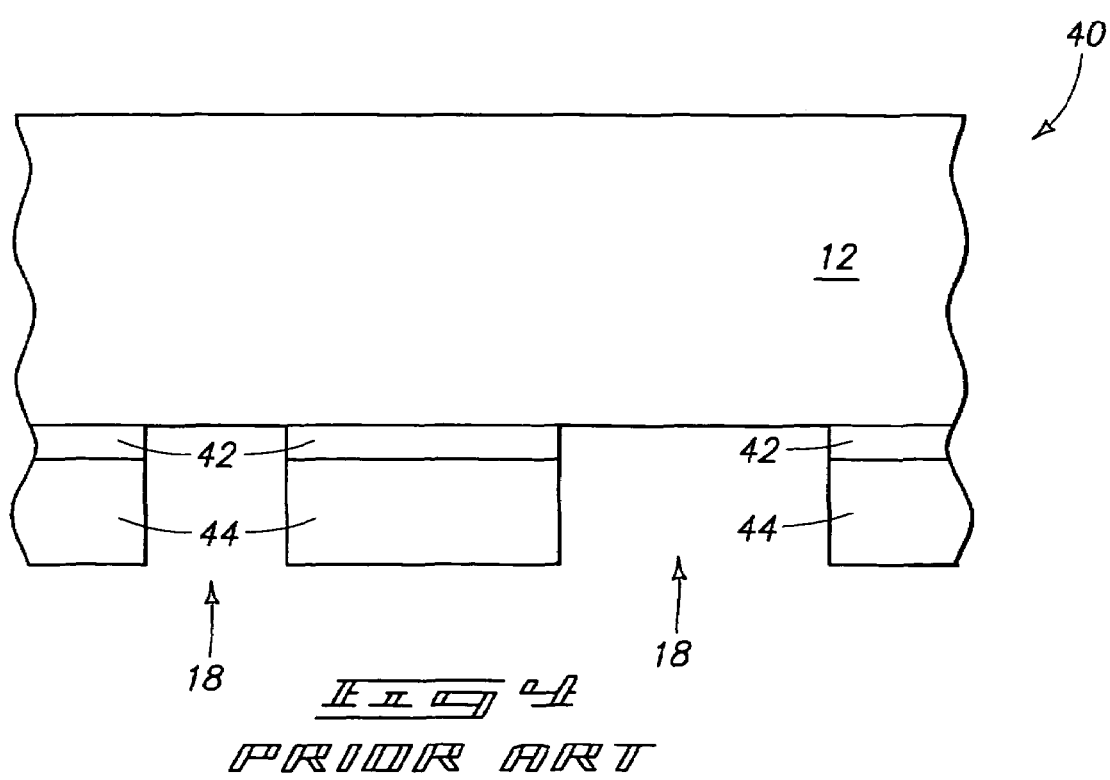
FIG. 4 is a diagrammatic, cross-sectional view of a reticle structure fragment in accordance with yet another aspect of the prior art.
Figure 9:
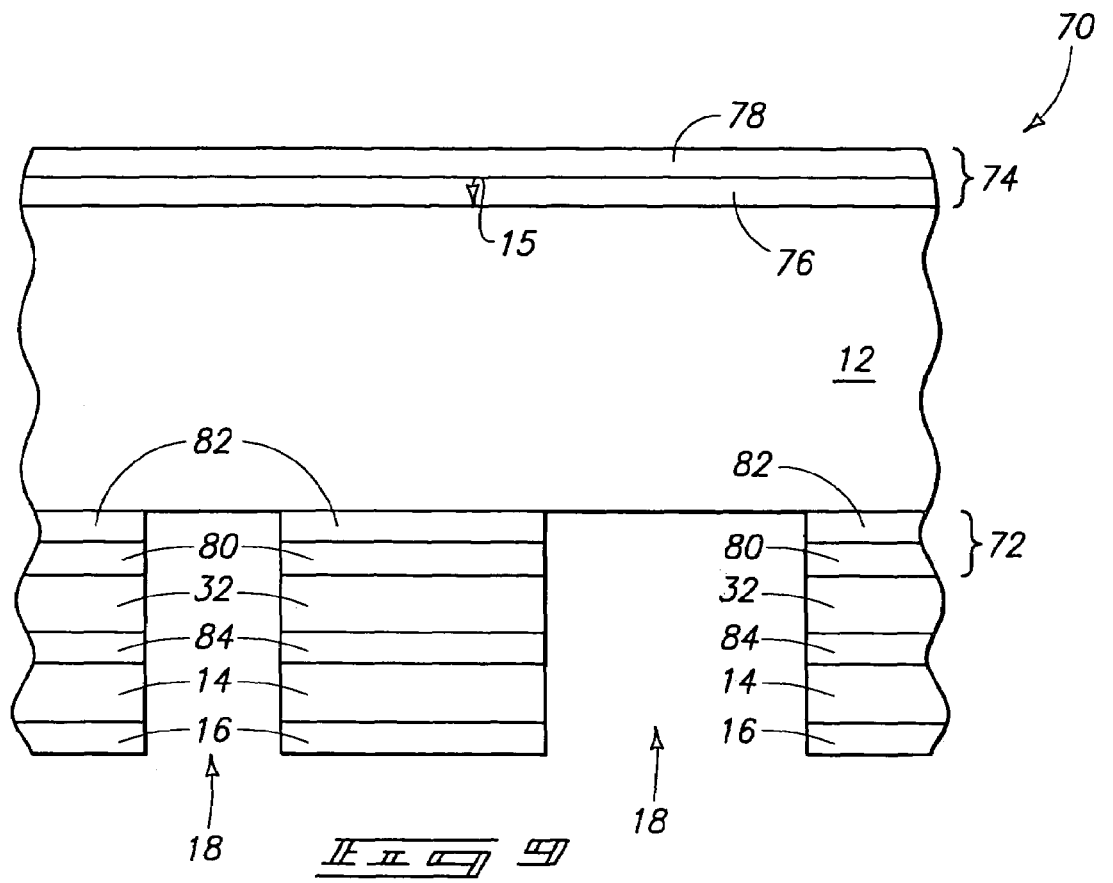
FIG. 9 is a view of the FIG. 8 fragment shown at a processing stage subsequent to that of FIG. 8.

FIGS. 8 and 9 show a reticle structure 70 illustrating another aspect of the present invention. Reticle 70 comprises a pair of opposing surfaces 73 and 75, which can be referred to as a first surface and second surface, respectively. In referring to FIGS. 8 and 9, similar numbering will be used as was utilized above in describing the prior art reticles of FIGS. 1-3, where appropriate.

Referring first to FIG. 8, the structure 70 comprises the relatively transparent material 12, radiation-attenuating layer 32, relatively opaque material 14, and antireflective material 16 described previously. Additionally, reticle 70 comprises a first antireflective structure 72 beneath relatively transparent material 12, and specifically directly against the surface 17 of material 12; and comprises a second antireflective structure 74 above material 12, and specifically directly against the surface 15 of material 12.

Antireflective structure 74 comprises a pair of layers 76 and 78 which can be identical to the layers 56 and 58 described above with reference to FIG. 6, and antireflective structure 72 comprises a pair of layers 80 and 82 which can be identical to the layers 60 and 62 described previously with reference to FIGS. 5 and 6. Accordingly, the antireflective structures 72 and 74 can comprise Fabry-Perot pairs.

As discussed previously, substrate 12 can be a quartz-containing substrate, and attenuating layer 32 can comprise, consist essentially of, or consist of tantalum or $Mo_wSi_xO_yN_z$, where w, x, y and z are numbers greater than 0.

The antireflective structure 72 is between the substrate 12 and attenuating layer 32. In the shown aspect of the invention, the antireflective structure 72 comprises a layer formed directly against the attenuating layer 32. In particular aspects, structure 72 can comprise a layer 82 comprising, consisting essentially of, or consisting of chromium; and a layer 80 comprising, consisting essentially of, or consisting of silicon dioxide or fused silica. Such layer 80 is the portion of antireflective structure 72 that is directly against attenuating layer 32.

The reticle of FIG. 8 is shown with layers 14 and 16. As discussed above with respect to FIG. 3, such layers may be present before and during patterning of a reticle, but will generally ultimately be removed from a primarily patterned area of a finished reticle. A difference between the reticle 70 of FIG. 8 and the prior art reticle 30 of FIG. 3, in addition to the antireflective structures 72 and 74 of the FIG. 8 reticle and in addition to the inclusion of layers 14 and 16 in the FIG. 8 reticle, is that the reticle 70 of FIG. 8 comprises an intervening layer 84 between attenuating layer 32 and relatively opaque material 14. The intervening layer 84 can be considered a shifting layer, which shifts a phase of radiation after the radiation has passed through attenuating layer 32. Shifting layer 84 is optional, but when included can comprise any suitable material, including, for example, silicon dioxide, and in particular aspects can include nitrogen-doped silicon dioxide. Shifting layer 84 may or may not be substantially transparent to the radiation passed through reticle 70. In some aspects, shifting layer 84 can comprise, consist essentially of, or consist of silicon dioxide or fused silica.

Although two antireflective structures are shown in the construction of FIG. 8 (specifically structures 72 and 74), it is to be understood that either of the structures can be omitted in various aspects of the invention, (but it is typically preferred to utilize both of the structures). Also, although the structures 72 and 74 are shown to each comprise paired materials (76/78 and 80/82, respectively), it is to be understood that the antireflective structures can comprise less than two layers or more than two layers in some aspects of the invention, but will typically comprise at least one layer having a higher refractive index than the relatively transparent material 12.

Referring next to FIG. 9, openings 18 are extended through layers 14, 16, 32, 80, 82 and 84. The openings form a pattern across structure 70, and such patterned structure corresponds to an attenuated phase shifting mask reticle structure analogous to that of FIG. 3, but having the advantage of having the antireflective structures 72 and 74 incorporated therein. The layers 14 and 16 are shown in the FIG. 9 structure, but it is to be understood that such layers would typically be ultimately removed from a primary patterned region of the reticle.

Although openings 18 are shown extending through all the layers 14, 16, 32, 80, 82 and 84, it is to be understood that the invention encompasses other aspects (not shown) in which the openings extend through less than all of the layers. For instance, the openings can extend through layers 14, 16, 32 and 84, but not through layers 80 and 82, in some aspects of the invention. Openings 18 can be formed with any suitable etchant chemistry or combination of etchant chemistries. For instance, if layer 32 comprises $Mo_wSi_xO_yN_z$, such can be etched with fluorine chemistry, and if the layer 32 comprises tantalum such can be etched with chlorine chemistry.

The shifting layer 84 can be formed to any desired thickness, and in some aspects will be formed to a thickness which results in a 180° phase shift (or any phase shift having the net effect of a 180° phase shift) for patterning light which is passed through the Fabry-Perot pair 82 and the attenuating layer 32 during lithography. A Fabry-Perot comprising 240 Å of chromium-containing material and 310 Å of silicon dioxide will typically transmit about 60% of the light, and accordingly the shifting layer 84 can be desired to change the phase of light that has passed through such exemplary Fabry-Perot pair of antireflective structure of 72.

Figure 10:
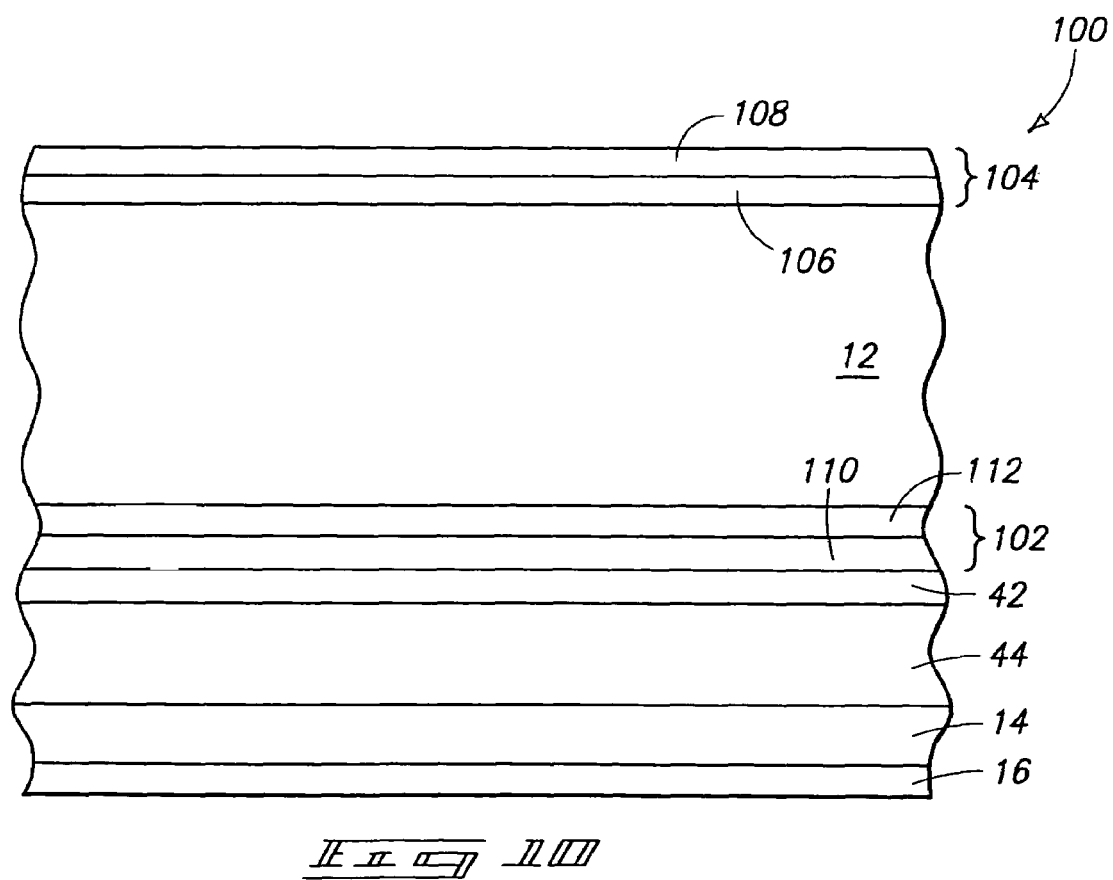
FIG. 10 is a diagrammatic, cross-sectional, fragmentary view of a reticle structure illustrating yet another aspect of the present invention.

Referring next to FIGS. 10 and 11, a reticle structure 100 is described illustrating another aspect of the invention. In referring to structure 100, similar numbering will be used as was utilized above in describing the prior art reticles of FIGS. 1-4, where appropriate.

Structure 100 comprises the relatively transparent material 12, relatively opaque material 14, antireflective material 16, attenuating layer 42, and phase shifting layer 44 described previously with reference to FIGS. 1 and 4. Additionally, reticle structure 100 comprises a first antireflective structure 102 between the relatively transparent material 12 and the attenuating layer 42, and comprises a second attenuating structure 104 over the relatively transparent material 12.

Attenuating structures 102 and 104 can be identical to the attenuating structures 52 and 54 described previously with reference to FIG. 6. Accordingly, antireflective structure 104 can comprise a Fabry-Perot pair containing layers 106 and 108 identical to layers 56 and 58, respectively, described with reference to FIG. 6; and antireflective structure 102 can comprise a Fabry-Perot pair containing layers 110 and 112 identical to the layers 60 and 62, respectively, described previously with reference to FIG. 6.

Referring to FIG. 11, openings 18 are etched through layers 14, 16, 42, 44, 110 and 112 to form a pattern of openings across the reticle structure, and accordingly to form a reticle which can be utilized for patterning radiation. The reticle corresponds to a bi-layer reticle structure analogous to the structure of FIG. 4, but advantageously containing the antireflective structures 102 and 104 of the present invention. It is to be understood that one of the antireflective structures 102 and 104 can be eliminated in some aspects of the invention (not shown). Also, it is to be understood that although openings 18 are shown extending through antireflective structure 102 in addition to in addition to layers 14, 16, 42 and 44, the invention encompasses other aspects (not shown) in which the openings are not extended through the antireflective structure. Additionally, it is to be understood that the layers 14 and 16 of the FIG. 11 structure can be ultimately removed from a primary patterned region of the reticle.

The antireflective structures of the present invention (for example, structures 52 and 54 of FIG. 6, structures 72 and 74 of FIG. 8, and structures 102 and 104 of FIG. 10) can be formed by any suitable methodology. An exemplary methodology is described with reference to FIGS. 12-16. In referring to such methodology, similar numbering will be used as was utilized above in describing FIGS. 5 and 6, where appropriate.

Referring initially to FIG. 12, a reticle substrate 12 is illustrated at a preliminary processing stage. Substrate 12 comprises a pair of opposing surfaces 15 and 17. Methodology of the present invention comprises forming antireflective structures over one or both of the surfaces 15 and 17.

Figure 13:
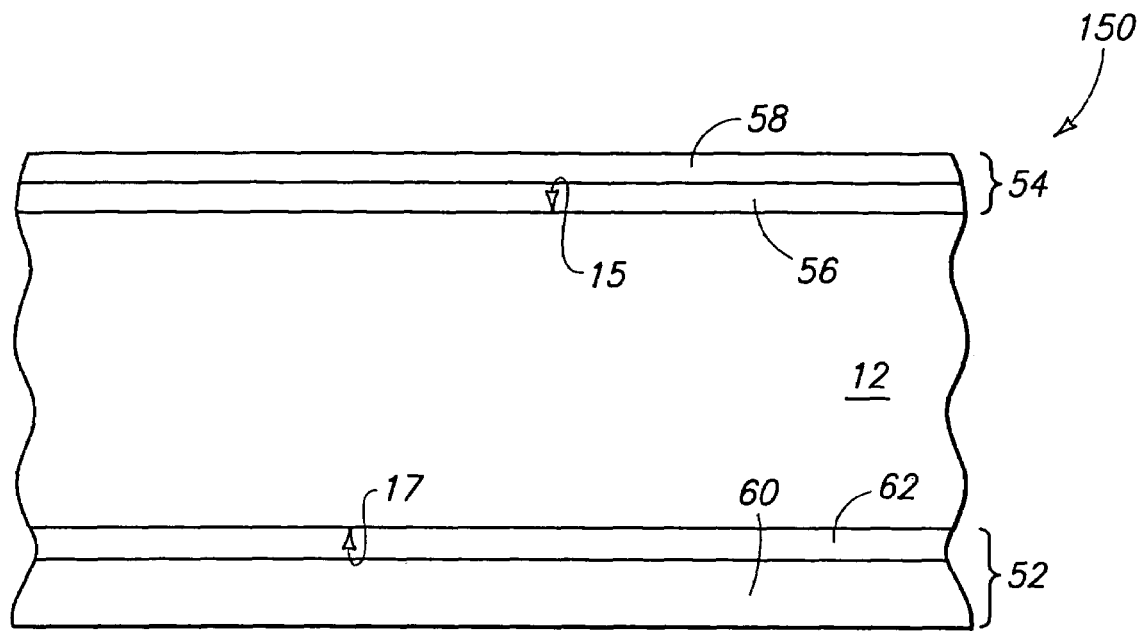
FIG. 13 is a view of the FIG. 12 fragment shown at a processing stage subsequent to that of FIG. 12.

Referring next to FIG. 13, antireflective structures 52 and 54 are shown formed over each of the opposing surfaces 15 and 17. The layers 56, 58, 60 and 62 can be formed by any suitable processing, including, for example, sputtering processes or evaporation processes, with particular exemplary processes including but not being limited to ion beam deposition, physical vapor deposition, atomic layer deposition and chemical vapor deposition. If layers 56 and 62 comprise an identical construction to one another, such layers can be formed simultaneously with one another. Similarly, if layers 58 and 60 comprise an identical construction as one another, such layers can also be formed simultaneously with one another. In other aspects, if layers 56 and 62, or 58 and 60, comprise a different composition from one another, the layers will typically be formed sequentially relative to one another.

Figure 14:
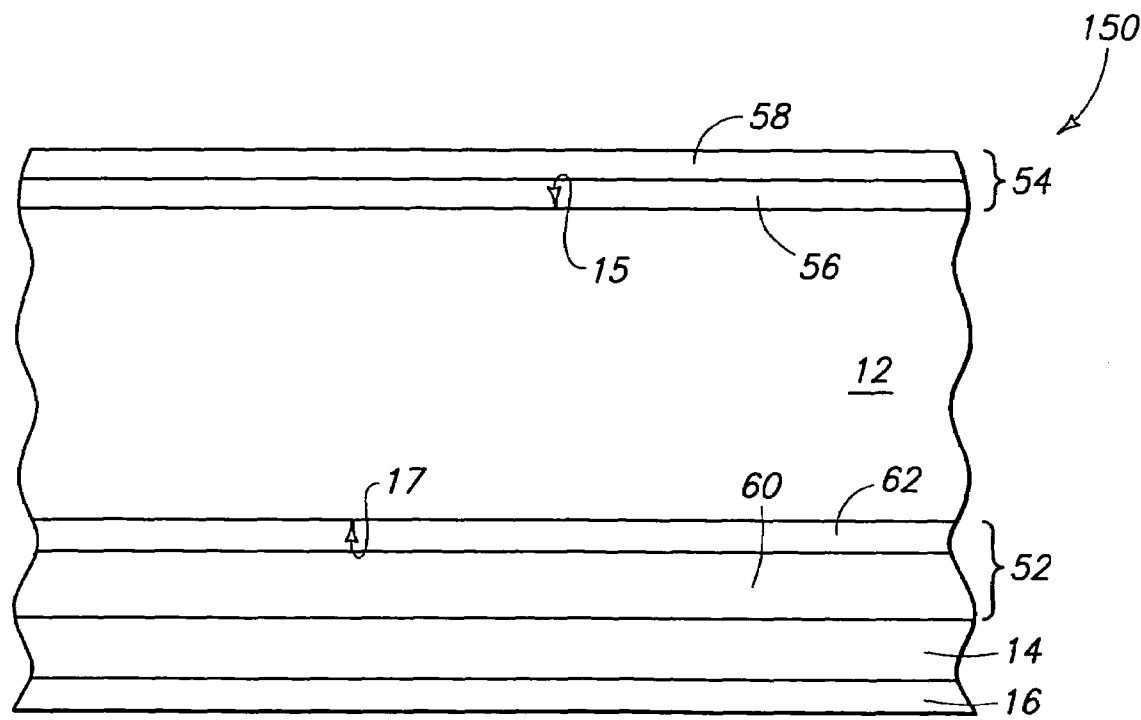
FIG. 14 is a view of the FIG. 12 fragment shown at a processing stage subsequent to that of FIG. 13, and is identical to FIG. 6.

Referring next to FIG. 14, layers 14 and 16 are formed to complete a reticle structure identical to the structure described previously with reference to FIG. 6. Such structure can then be subjected to further processing to form the openings 18 described with reference to FIG. 7. The materials 14 and 16 can be referred to as being formed over surface 17, even though the materials 14 and 16 are actually under the surface 17 in the diagram of FIG. 14. It is to be understood that the term "over" as utilized herein applies to the relative orientation of materials to one another, rather than to the orientation relative to an external frame of reference. Accordingly, material 60 can be described as being over surface 17, and surface 17 can also be described as being over material 60.

Figure 15:
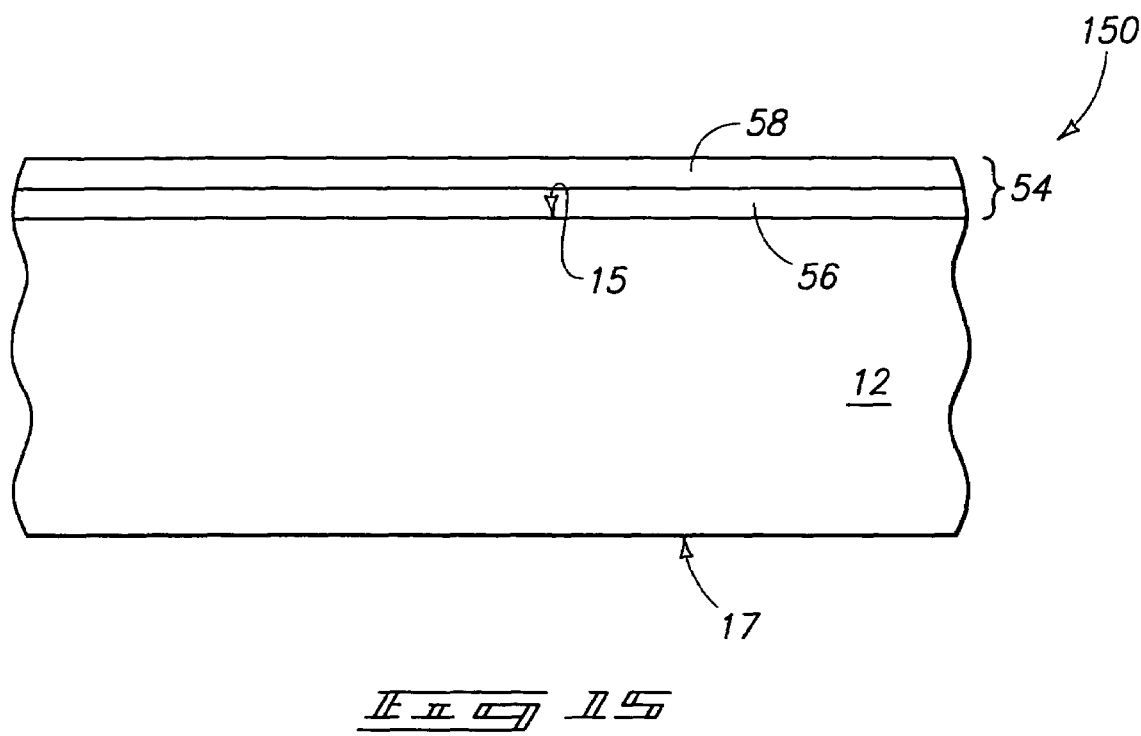
FIG. 15 is a view of the FIG. 12 fragment shown at a processing stage subsequent to that of FIG. 12 in accordance with an aspect of the invention alternative to that of FIG. 13.
Figure 16:
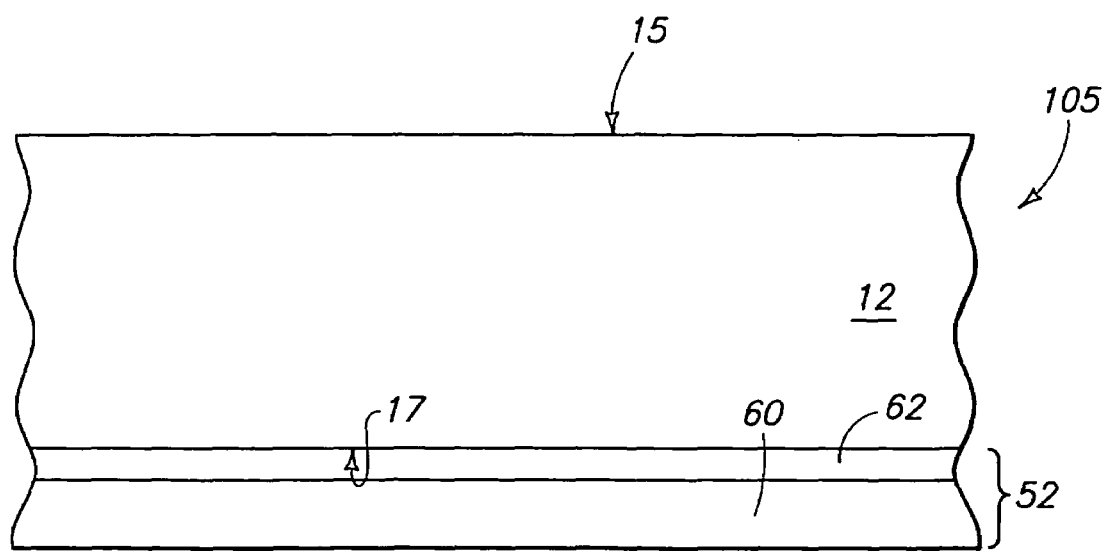
FIG. 16 is a view of the FIG. 12 fragment shown at a processing stage subsequent to that of FIG. 12 in accordance with an aspect of the invention alternative to those of FIGS. 13 and 15.

As discussed previously, the invention encompasses aspects in which only one of the antireflective structures 52 and 54 is formed. FIGS. 15 and 16 illustrate such aspects, with FIG. 15 showing an aspect in which only the antireflective structure 54 has been formed over substrate 12, and FIG. 16 illustrating an aspect in which only the antireflective structure 52 has been formed. The structures of FIGS. 15 and 16 can subsequently be subjected to processing analogous to that described with reference to FIGS. 14 and 7 to form patterned reticles from the structures.

Although the methodologies of FIGS. 12-16 are described with reference to formation of the binary mask reticle structure of FIGS. 6 and 7, it is to be understood that such methodologies can be readily extended to formation of the attenuated phase shifting mask reticle structure of FIGS. 8 and 9, and the bi-layer reticle structure of FIGS. 10 and 11.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A reticle, comprising:
   a base;
   an attenuating layer supported by the base; and
   an antireflective structure between the attenuating layer and the base.

2. The reticle of claim 1 wherein the antireflective structure is a first antireflective structure and further comprising a second antireflective structure on an opposing side of the base from the first antireflective structure.

3. The reticle of claim 2 wherein the second antireflective structure comprises a layer comprising one or more of metal fluoride, niobium oxide and hafnium oxide.

4. The reticle of claim 1 wherein the antireflective structure is a Fabry-Perot pair of a first layer and a second layer.

5. The reticle of claim 4 wherein the attenuating layer comprises $Mo_w Si_x O_y N_z$, where w, x, y and z are numbers greater than 0.

6. The reticle of claim 4 wherein the attenuating layer comprises tantalum.

7. The reticle of claim 4 wherein the first layer comprises chromium.

8. The reticle of claim 4 wherein the first layer comprises chromium and the second layer comprises one or both of silicon dioxide and fused silica.

9. The reticle of claim 1 wherein the base comprises quartz, and having openings extending through the antireflective structure and attenuating layer to the quartz of the base.

10. A reticle, comprising:
    a quartz-containing region;
    a chromium-containing region under the quartz-containing region;
    a first antireflective structure between the quartz-containing region and the chromium-containing region, the first antireflective structure comprising Fabry-Perot paired layers;
    a pattern of openings extending through the chromium-containing region and through the first antireflective structure; and
    a second antireflective structure over the quartz-containing region; the second antireflective structure comprising a layer containing one or more of metal fluoride, niobium oxide and hafnium oxide, and comprising another layer containing one or both of silicon dioxide and fused silica.

11. A reticle, comprising:
    a first layer comprising one or more of metal fluoride, niobium oxide and hafnium oxide;
    a quartz base over the first layer;
    a first antireflective structure over the quartz base, the first antireflective structure comprising a relatively low refractive index second layer paired with a relatively high refractive index third layer, the relatively high refractive index third layer being directly against the quartz base;
    a chromium-containing material over the first antireflective structure; and
    a pattern of openings extending through the chromium-containing material and through the first antireflective structure.

12. A reticle, comprising:
    a relatively opaque material;
    a first Fabry-Perot pair over the relatively opaque material; the first Fabry-Perot pair comprising a first layer and a second layer that is compositionally different from the first layer; the first layer being between the second layer and the relatively opaque material;
    a relatively transparent material over the first Fabry-Perot pair, and directly against the second layer;
    a second Fabry-Perot pair over the relatively transparent material; the second Fabry-Perot pair comprising a relatively high refractive index material directly against the relatively transparent material, and comprising a relatively low refractive index material directly against the relatively high refractive index material; and
    a pattern of openings extending through the relatively opaque material and through the first Fabry-Perot pair.

13. A method of forming a reticle, comprising:
    providing a quartz-containing substrate;
    forming an antireflective structure over the substrate; the antireflective structure being formed to comprise Fabry-Perot paired layers;
    forming a tantalum-comprising attenuating layer over the antireflective structure;
    forming a chromium-containing material over the attenuating layer; and
    forming a pattern of openings extending through the chromium-containing material, through the attenuating layer, and through the antireflective structure.

14. The method of claim 13 wherein one of the Fabry-Perot paired layers comprises one or more of metal fluoride, niobium oxide and hafnium oxide.

* * * * *

UNITED STATES PATENT AND TRADEMARK OFFICE
CERTIFICATE OF CORRECTION

PATENT NO. : 7,494,750 B2  
APPLICATION NO. : 11/478887  
DATED : February 24, 2009  
INVENTOR(S) : Rolfson Page 1 of 1

It is certified that error appears in the above-identified patent and that said Letters Patent is hereby corrected as shown below:

On the Title Page, Item -54-, in "Title", line 1, delete "RETICLES" and insert -- RETICLES AND METHODS OF FORMING RETICLES --, therefor.

In column 1, line 1, delete "RETICLES" and insert -- RETICLES AND METHODS OF FORMING RETICLES --, therefor.

Signed and Sealed this

Fifth Day of May, 2009

JOHN DOLL
*Acting Director of the United States Patent and Trademark Office*